United States Patent
Sasaki

(10) Patent No.: US 8,466,069 B2
(45) Date of Patent: Jun. 18, 2013

(54) METHOD FOR MANUFACTURING SEMICONDUCTOR DEVICE

(75) Inventor: Toshiyuki Sasaki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 56 days.

(21) Appl. No.: 13/232,765

(22) Filed: Sep. 14, 2011

(65) Prior Publication Data

US 2012/0244672 A1    Sep. 27, 2012

(30) Foreign Application Priority Data

Mar. 24, 2011    (JP) .................................. 2011-066545

(51) Int. Cl.
  *H01L 21/311*    (2006.01)
(52) U.S. Cl.
  USPC ........... 438/700; 438/270; 438/680; 438/712; 257/E21.006; 257/E21.17; 257/E21.218; 257/E21.231; 257/E21.267; 257/E21.278; 257/E21.293; 257/E21.577; 257/E21.585
(58) Field of Classification Search
  USPC .................. 438/700, 270, 743, 300, 712, 680, 438/657, 682, 723, 722, 724, 725; 257/E21.006, 257/E21.293, E21.17, E21.218, E21.231, 257/E21.267, E21.278, E21.577, E21.585
  See application file for complete search history.

(56) References Cited

U.S. PATENT DOCUMENTS

| 6,720,603 B2* | 4/2004 | Iijima et al. ................... 257/303 |
| 8,080,841 B2* | 12/2011 | Kanaya .......................... 257/295 |
| 2007/0069743 A1* | 3/2007 | Inoue et al. ................... 324/754 |

FOREIGN PATENT DOCUMENTS

JP    2007-81107    3/2007

* cited by examiner

*Primary Examiner* — David Nhu
(74) *Attorney, Agent, or Firm* — Finnegan, Henderson, Farabow, Garrett & Dunner, L.L.P.

(57) ABSTRACT

According to one embodiment, a method is disclosed for manufacturing a semiconductor device. The method can form a plurality of grooves extending in a first direction on a semiconductor substrate. The method can form an insulating layer on the inner face of the groove and on the top face of the semiconductor substrate. The method can deposit a first conductive layer on the insulating layer so as to fill in the groove. The method can deposit a second conductive layer on the first conductive layer. The method can form a hard mask in a region including part of a region immediately above the groove on the second conductive layer. The method can form a columnar body including the hard mask and the second conductive layer by etching the second conductive layer using the hard mask as a mask.

20 Claims, 20 Drawing Sheets

METHOD FOR MANUFACTURING SEMICONDUCTOR DEVICE

CROSS-REFERENCE TO RELATED APPLICATIONS

This application is based upon and claims the benefit of priority from the prior Japanese Patent Application No. 2011-066545, filed on Mar. 24, 2011; the entire contents of which are incorporated herein by reference.

FIELD

Embodiments described herein relate generally to a method for manufacturing semiconductor device.

BACKGROUND

When the degree of integration of LSI (large scale integrated circuit) increases and the width of a gate electrode of a transistor is miniaturized, in a transistor in which gate electrodes and sources/drains are arranged in a planar manner, the channel length is reduced and it becomes difficult to suppress a leak current between the source/drain.

Hence, an attempt is made to form a channel structure into a three-dimensional structure. As a transistor having the three-dimensional channel structure, mention is made of a recessed channel transistor (RCAT).

In the recessed channel transistor, part of a gate electrode is embedded inside a groove formed on a semiconductor substrate. Then, an insulating layer formed on the inner wall of the groove functions as a gate insulating layer and a region along the groove of the semiconductor substrate constitutes a channel.

By forming a channel structure into a three-dimensional structure as described above, it is possible to miniaturize the width of the gate electrode while ensuring the channel length in such a degree that a leak current can be suppressed.

Further, in such a three-dimensional structure, the source/drain end is widened, and therefore, it is also possible to increase the amount of an electric current flowing through the channel.

DETAILED DESCRIPTION

In general, according to one embodiment, a method is disclosed for manufacturing a semiconductor device. The method can form a plurality of grooves extending in a first direction on a semiconductor substrate. The method can form an insulating layer on the inner face of the groove and on the top face of the semiconductor substrate. The method can deposit a first conductive layer on the insulating layer so as to fill in the groove. The method can deposit a second conductive layer on the first conductive layer. The method can form a hard mask in a region including part of a region immediately above the groove on the second conductive layer. The method can form a columnar body including the hard mask and the second conductive layer by etching the second conductive layer using the hard mask as a mask. The method can form an electrode processing sidewall on two side faces facing each other in a width direction of the groove in the columnar body. The method can remove the upper part of exposed portion in the first conductive layer and leaving the lower part by performing etching using the columnar body and the electrode processing sidewall as a mask. The method can remove the electrode processing sidewall. The method can remove the lower part of the exposed portion by performing etching using the columnar body as a mask.

According to another embodiment, a method is disclosed for manufacturing a semiconductor device. The method can form a plurality of grooves extending in a first direction on a semiconductor substrate. The method can form an insulating layer on the inner face of the groove and on the top face of the semiconductor substrate. The method can deposit a first conductive layer on the insulating layer so as to fill in the groove. The method can deposit a second conductive layer on the first conductive layer. The method can form a hard mask in a region including part of a region immediately above the groove on the second conductive layer. The method can form a columnar body including the hard mask and the second conductive layer by etching the second conductive layer using the hard mask as a mask. The method can form an electrode processing sidewall on two side faces facing each other in a width direction of the groove in the columnar body. The method can remove an exposed portion in the first conductive layer by performing etching using the columnar body and the electrode processing sidewall as a mask. The method can remove the electrode processing sidewall.

Various embodiments will be described hereinafter with reference to the accompanying drawings.

First Embodiment

Hereinafter, embodiments of the invention are explained with reference to the drawings.

First, a first embodiment is explained.

The embodiment relates to a semiconductor device.

Figure 1:
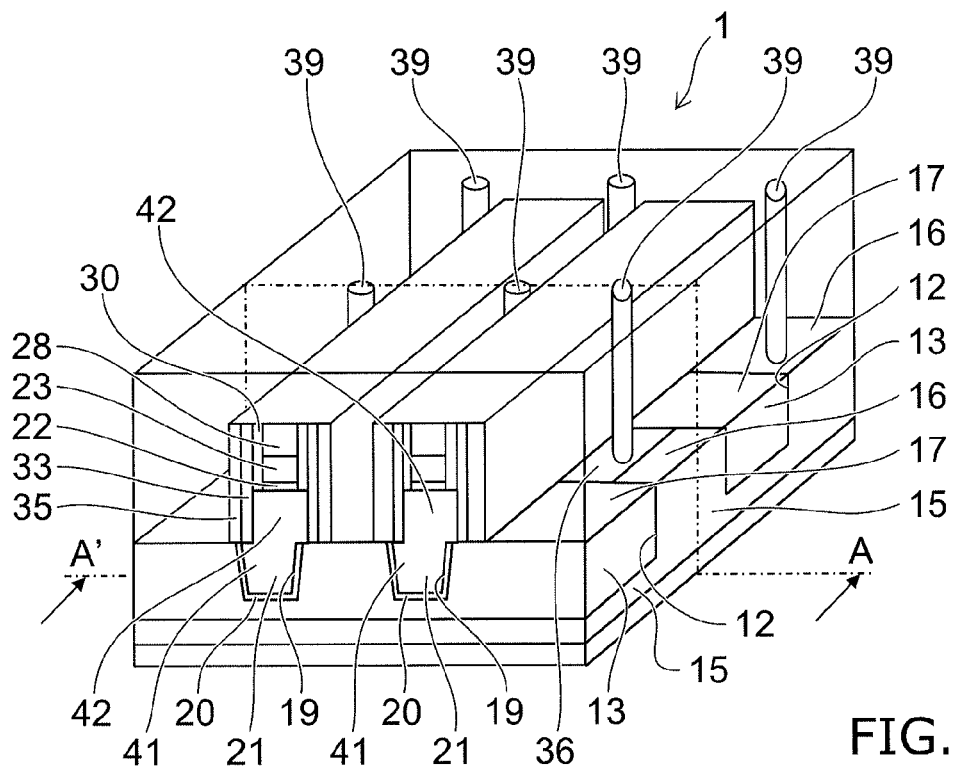
FIG. 1 is a perspective view illustrating a semiconductor device according to a first embodiment.

FIG. 1 is a perspective view illustrating a semiconductor device according to the first embodiment.

Figure 2:
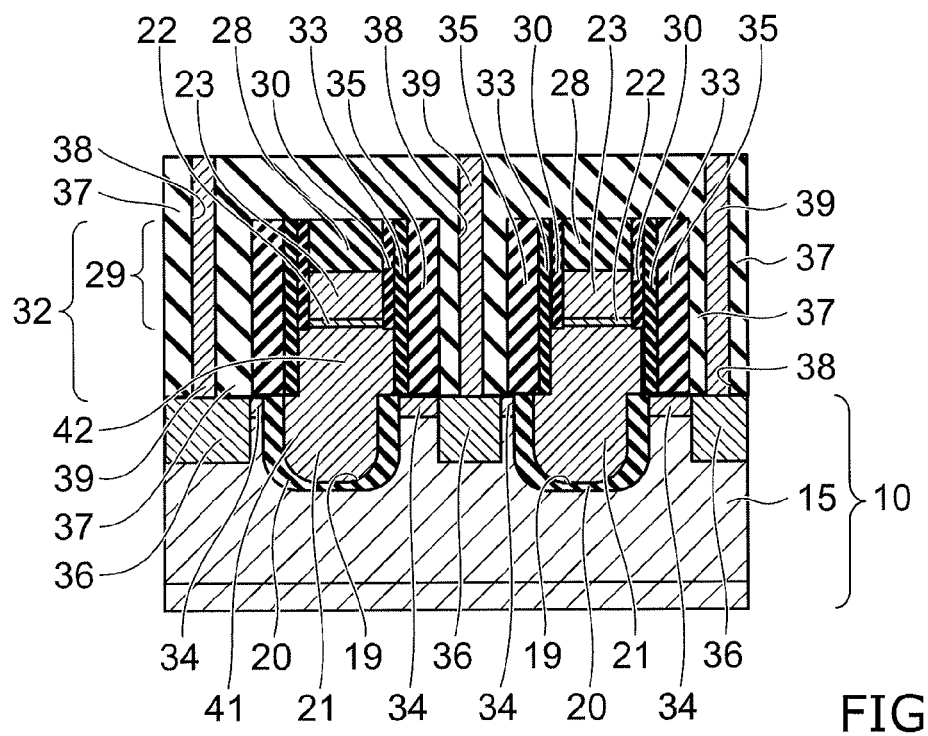
FIG. 2 is a sectional view illustrating the semiconductor device according to the first embodiment, a sectional view along an A-A' plane shown in FIG. 1.

FIG. 2 is a sectional view illustrating the semiconductor device according to the first embodiment, a sectional view along an A-A' plane shown in FIG. 1.

First, a configuration of the semiconductor device according to the first embodiment is explained.

As shown in FIG. 1 and FIG. 2, in a semiconductor device 1, a semiconductor substrate, for example, a silicon substrate 10 is provided. On the top face of the silicon substrate 10, a plurality of grooves 12 extending in one direction is formed in parallel with each other. Inside the groove 12, an insulating material, for example, silicon oxide 13 is embedded. A region where the silicon oxide 13 is embedded inside the groove 12 is referred to as an STI (Shallow Trench Isolation) region 17. A region sandwiched by the STI regions 17 is referred to as an active region 16

Into the silicon substrate 10, impurities, for example, boron is introduced from the surface of the silicon substrate 10 to a region deeper than the bottom face of the groove 12 and thereby a well 15 is formed In the silicon substrate 10, a groove 19 extending in a direction perpendicular to the direction in which the STI region 17 and the active region 16 extend is provided.

On the inner face of the groove 19, a gate insulating layer, for example, a silicon oxide film 20 is formed. Inside the groove 19, a conductive material, for example, polysilicon is embedded. The portion of the polysilicon embedded inside the groove 19 is referred to as a lower conductive part 41. Into the polysilicon, impurities, for example, phosphorus is introduced.

In a region including an outer edge of the groove 19 in a surface layer portion of the active region 16, an extended region 34 into which impurities, for example, phosphorus is introduced is formed. Next to the extended regions 34 on both sides with the groove in the surface layer portion of the active region 16 sandwiched in between, a source/drain region 36 is formed, respectively. Into the source/drain region 36, impurities, for example, phosphorus is introduced in a concentration higher than that of the impurities introduced into the extended region 34. Further, into source/drain region 36, impurities are introduced deeper than the extended region 34.

In a region including part of a region immediately above the groove 19, a columnar body made of a conductive material is provided along the groove 19 in substantially the same width as that of the groove 19. Here, the length of the groove 19 in the width direction is referred to as "width". The columnar body provided on the groove 19 is made of the polysilicon, the same material as the conductive material embedded inside the groove 19, and integrated with the lower conductive part 41 embedded inside the groove 19. The columnar body made of polysilicon provided on the groove 19 is referred to as an upper conductive part 42.

The upper conductive part 42 and the lower conductive part 41 are together referred to as a conductive part 43.

There is produced a deviation between the position of the upper conductive part 42 and the position of the lower conductive part 41 and the groove 19. The amount of the deviation is within an estimated range.

On the upper conductive part 42, a barrier metal layer 22 is provided. As the barrier metal layer 22, mention is made of a stacked film of titanium and titanium nitride. On the barrier metal layer 22, a low-resistance metal layer 23 is provided. As a material of the low-resistance metal layer 23, mention is made of tungsten. On the low-resistance metal layer 23, a hard mask 28 is provided. As a material of the hard mask 28, mention is made of silicon nitride. The conductive part 43, the barrier metal layer 22, and the low-resistance metal layer 23 form a gate electrode.

The hard mask 28, the low-resistance metal layer 23, and the barrier metal layer 22 are stacked to constitute a columnar body 29. When the barrier metal layer 22 in the columnar body 29 is a stacked film of titanium and titanium nitride, there may be a case where titanium included in the stacked film is oxidized by oxidation heat treatment in the manufacturing process. Hence, in order to prevent the oxidation of titanium, a barrier metal sidewall 30 is provided on the side face of the stacked body of the hard mask 28, the low-resistance metal layer 23, and the barrier metal layer 22. As a material of the barrier metal sidewall 30, mention is made of silicon nitride. When the barrier metal sidewall 30 is provided, the stacked structure including the barrier metal sidewall 30 is referred to as the columnar body 29.

A columnar body 32 is configured by the upper conductive part 42 and the columnar body 29.

On the side face of the columnar body 32, an extension sidewall 33 and a source/drain sidewall 35 are provided. The position when the end part of the side face of the extension sidewall 33 is viewed from above is substantially the same as the position when the end part on the side of the groove 19 of the extended region 34 is viewed from above. The position when the end part of the side face of the source/drain sidewall 35 is viewed from above is substantially the same as the position when the end part on the side of the groove 19 of the source/drain region 36 is viewed from above.

On the silicon substrate 10, an interlayer insulating layer 37 is provided. In FIG. 1, in order to make the drawing easier-to-see, the interlayer insulating layer 37 is omitted. On the source/drain region 36 in the interlayer insulating layer 37, a contact hole 38 is formed. Inside the contact hole 38, a contact 39 is provided.

On the surface of the source/drain region 36, silicide, for example, nickel silicide is provided. The contact 39 embedded inside the contact hole 38 is joined to the silicide on the source/drain surface.

Next, the operation of the semiconductor device according to the first embodiment is explained.

First, a voltage is loaded onto the gate electrode of the semiconductor device 1. Then, the silicon oxide film 20 provided on the inner face of the groove 19 functions as a gate insulating layer. The region along the groove 19 of the silicon substrate 10 functions as a channel and an inversion layer is formed. Then, if a voltage is loaded between source and drain, carriers move within the inversion layer and an electric current flows. By changing the voltage of the gate electrode, an amount of electric current flowing between source and drain is controlled.

Next, the effect of the semiconductor device according to the first embodiment is explained.

It is possible to perfectly embed polysilicon, which is formed into part of the gate electrode, inside the groove 19 to obtain a recessed channel. Thus, even if the design rule is miniaturized and there is produced a deviation between the groove and the gate electrode due to lithography, it is possible to manufacture a recessed channel transistor. Consequently, it is possible to provide a highly integrated semiconductor device that has increased the channel length while miniaturizing the width of the gate electrode.

Second Embodiment

Next, a semiconductor device according to a second embodiment is explained.

Figure 3:
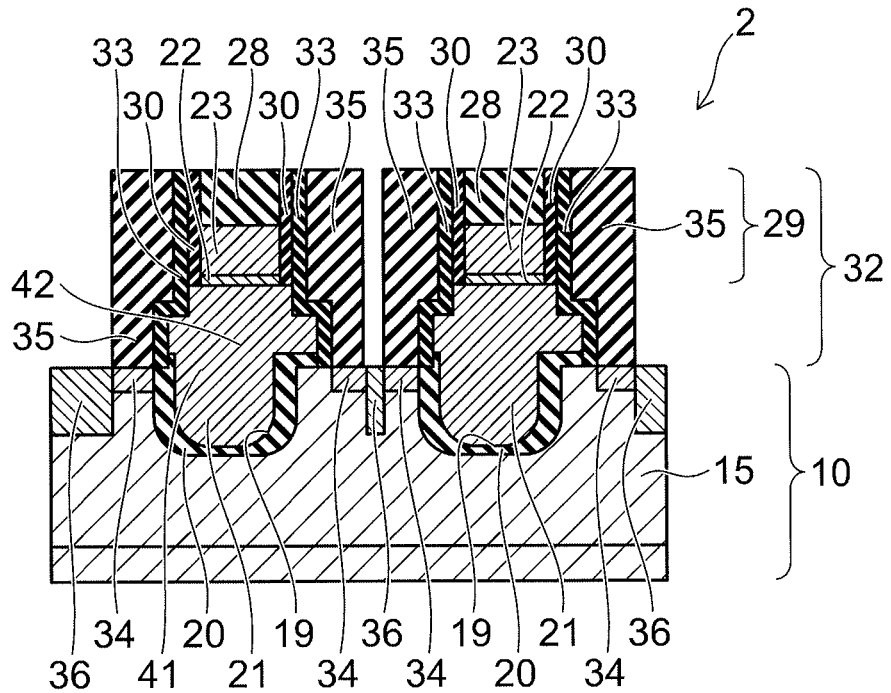
FIG. 3 is a sectional view illustrating a semiconductor device according to a second embodiment.

FIG. 3 is a sectional view illustrating the semiconductor device according to the second embodiment.

As shown in FIG. 3, in the embodiment, on the side face of the upper conductive part 42, a step is provided.

The width of the face facing upward in the step is substantially the same as the width of the deviation between the position of the groove 19 and the position of the columnar body 32.

The width of the top face of the upper conductive part 42 is substantially the same as the width of the columnar body 29 and the width of the groove 19.

On the other hand, the width of the under face of the upper conductive part 42 is greater than the width of the columnar body 29 and the width of the groove 19.

The extension sidewall and the source/drain sidewall are provided in accordance with the shape of the side face of the columnar body 32.

The position when the outermost end part of the side face of the extension sidewall 33 is viewed from above is substantially the same as the position when the end part on the side of the groove 19 of the extended region 34 is viewed from above. The position when the outermost end part of the side face of the source/drain sidewall 35 is viewed from above is substantially the same as the position when the end part on the side of the groove 19 of the source/drain region 36 is viewed from above.

Other configurations are the same as those of the first embodiment, and therefore, their explanation is omitted. Further, the operation is also the same, and therefore, its explanation is omitted.

Next, the effect of the semiconductor device according to the second embodiment is explained.

In the second embodiment, the width of the lower part of the upper conductive part 42 is made great. Consequently, it is possible to perfectly embed polysilicon, which is formed into part of the electrode, inside the groove 19 to cover the lower conductive part 41 and to form a recessed channel. As a result, it is possible to realize a recessed channel and to provide a highly integrated semiconductor device.

Third Embodiment

Next, a third embodiment is explained.

Figure 4:
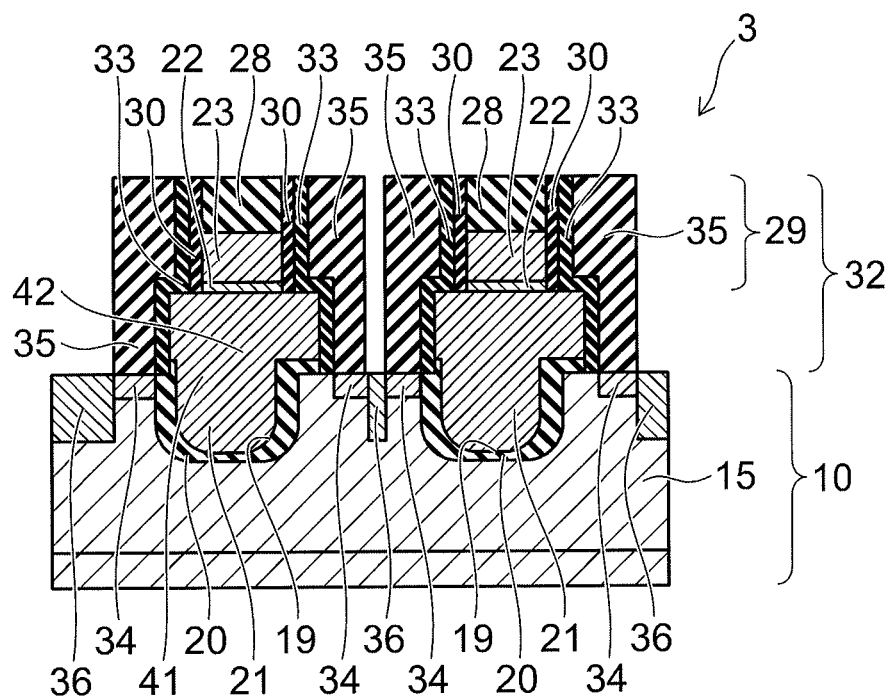
FIG. 4 is a sectional view illustrating a semiconductor device according to a third embodiment.

FIG. 4 is a sectional view illustrating a semiconductor device according to the third embodiment.

As shown in FIG. 4, in the embodiment, the width of the upper conductive part 42 is made greater than the width of the columnar body 29 and the width of the groove 19. Further, different from the second embodiment, no step is provided on the side face of the upper conductive part 42.

The extension sidewall and the source/drain sidewall are provided in accordance with the shape of the side face of a second columnar body.

Other configurations are the same as those of the first embodiment, and therefore, their explanation is omitted. Further, the operation and the effect are also the same, and therefore, their explanation is omitted.

Fourth Embodiment

Next, a fourth embodiment is explained.

The embodiment relates to a method for manufacturing the semiconductor device according to the first embodiment.

Figure 11:
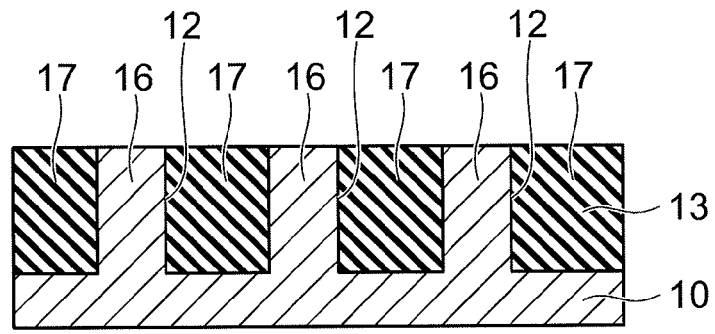
FIG. 11 is a process sectional view illustrating the method for manufacturing the semiconductor device according to the fourth embodiment.
Figure 12:
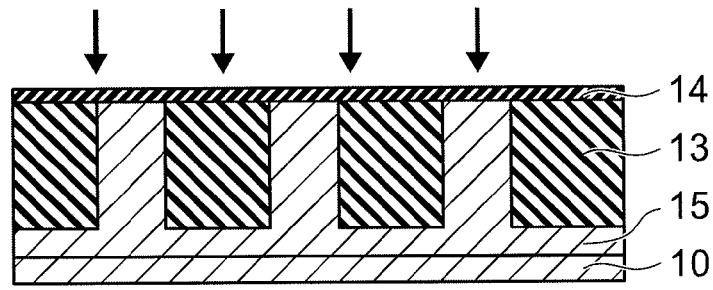
FIG. 12 is a process sectional view illustrating the method for manufacturing the semiconductor device according to the fourth embodiment.
Figure 13:
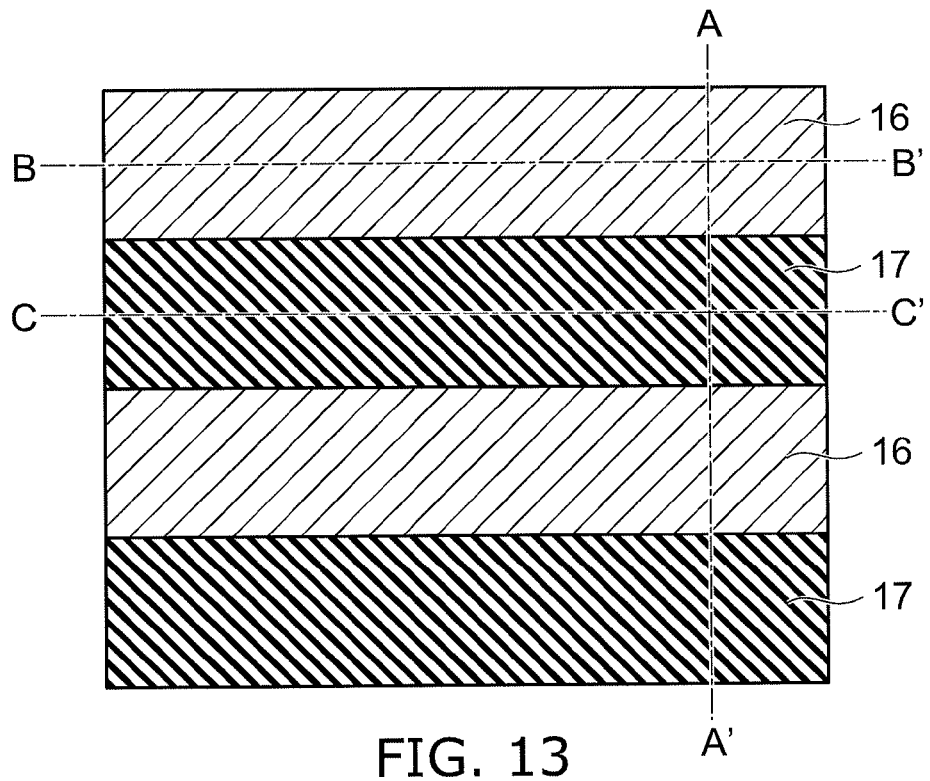
FIG. 13 is a process plan view illustrating the method for manufacturing a semiconductor device according to the fourth embodiment.
Figure 14:
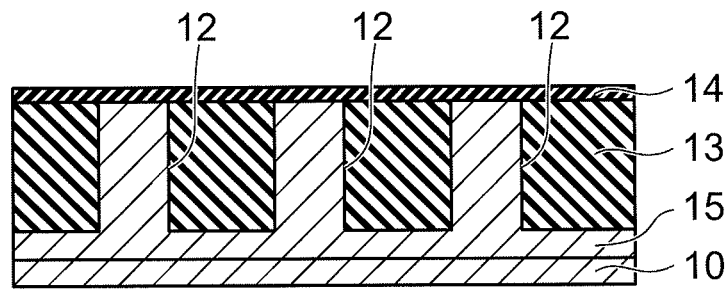
FIG. 14 is a process sectional view along an A-A' line shown in FIG. 13.
Figure 15:
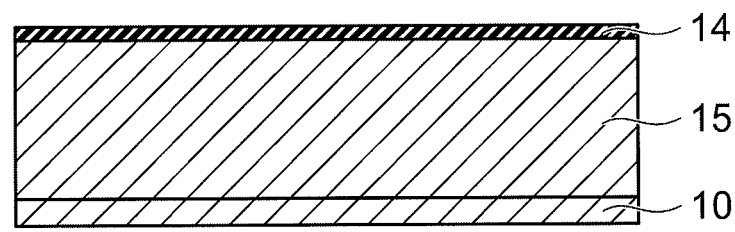
FIG. 15 is a process sectional view along a B-B' line shown in FIG. 13.
Figure 16:
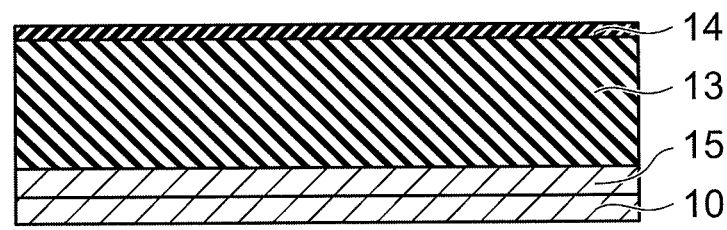
FIG. 16 is a process sectional view along a C-C' line shown in FIG. 13.

FIGS. 5 to 12 are process sectional views illustrating the method for manufacturing a semiconductor device according to the fourth embodiment, FIG. 13 is a process plan view illustrating the method for manufacturing a semiconductor device according to the fourth embodiment, FIG. 14 is a process sectional view along an A-A' line shown in FIG. 13, FIG. 15 is a process sectional view along a B-B' line shown in FIG. 13, FIG. 16 is a process sectional view along a C-C' line shown in FIG. 13, and FIG. 17 to FIG. 38 are process sectional views illustrating the method for manufacturing a semiconductor device according to the fourth embodiment.

Figure 5:
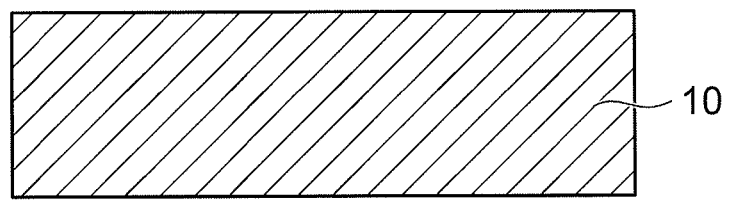
FIG. 5 is a process sectional view illustrating a method for manufacturing a semiconductor device according to a fourth embodiment.

First, as shown in FIG. 5, the silicon substrate 10 made of, for example, single crystal silicon (Si) is prepared.

Figure 6:
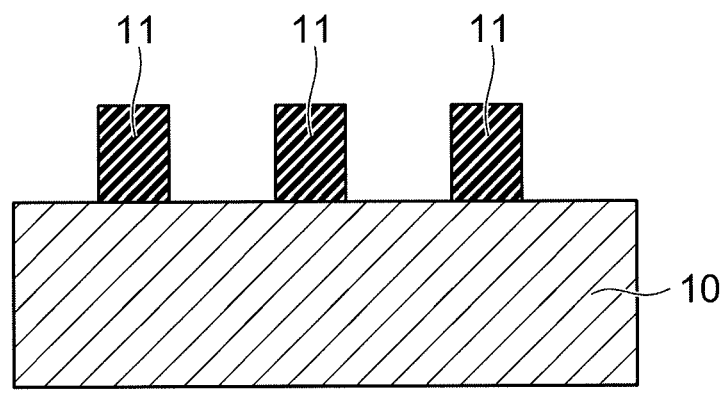
FIG. 6 is a process sectional view illustrating the method for manufacturing the semiconductor device according to the fourth embodiment.

Then, as shown in FIG. 6, after forming, for example, an SiN film as a film that is formed into a hard mask 11 on the silicon substrate 10, a hard mask 11 is formed by patterning the film by the photolithography method etc. The hard mask 11 is formed in parallel with one direction on the silicon substrate 10.

Figure 7:
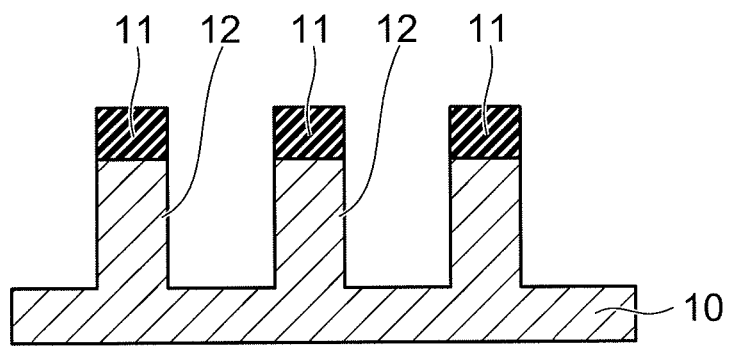
FIG. 7 is a process sectional view illustrating the method for manufacturing the semiconductor device according to the fourth embodiment.

Next, as shown in FIG. 7, by performing reactive ion etching using the hard mask 11 as a mask, the groove 12 that is formed into the STI region 17 is formed in the upper layer portion of the silicon substrate 10. At this time, the region covered with the hard mask 11 and which is not etched is formed into the active region 16.

Figure 8:
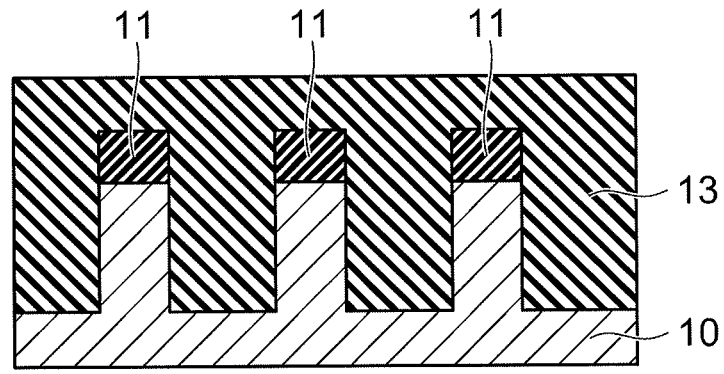
FIG. 8 is a process sectional view illustrating the method for manufacturing the semiconductor device according to the fourth embodiment.

After that, as shown in FIG. 8, the top of the silicon substrate 10 including the groove 12 and the hard mask 11 is covered with the silicon oxide film 13.

Figure 9:
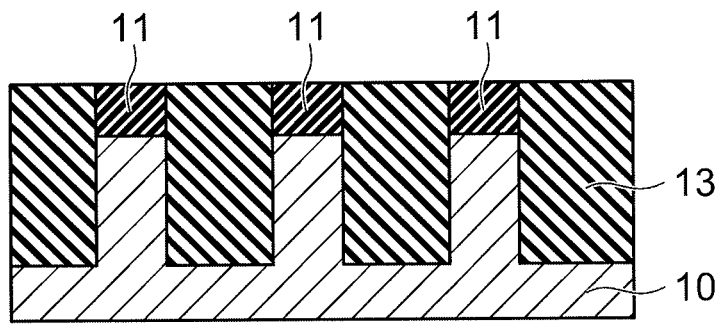
FIG. 9 is a process sectional view illustrating the method for manufacturing the semiconductor device according to the fourth embodiment.

Then, as shown in FIG. 9, by the CMP (Chemical Mechanical Polishing) method, the silicon oxide film 13 is polished until the surface of the hard mask appears and thereby the top face of the silicon oxide film 13 is flattened.

Figure 10:
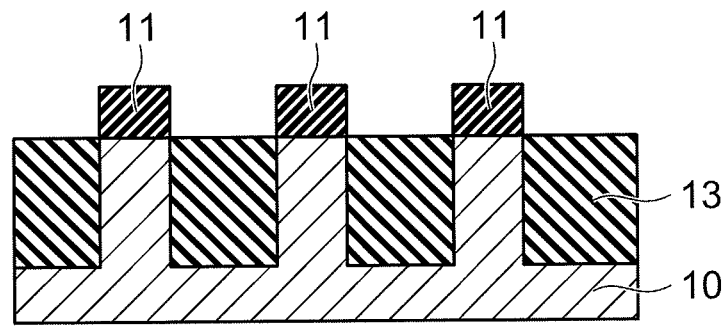
FIG. 10 is a process sectional view illustrating the method for manufacturing the semiconductor device according to the fourth embodiment.

Next, as shown in FIG. 10, by wet etching, the silicon oxide film 13 is removed down to the bottom face of the hard mask 11, that is, down to the top face of the portion of the silicon substrate 10 covered with the hard mask 11.

After that, as shown in FIG. 11, by wet etching, the hard mask 11 (see FIG. 10) is removed. The region where the top face of the silicon substrate 10 appears is the active region 16. Further, the region where the silicon oxide film 13 is embedded in the groove 12 is the STI region 17. In the STI region 17, the top face of the silicon oxide film 13 appears on the surface.

Then, as shown in FIG. 12, a silicon oxide film 14 is formed on the top face of the silicon substrate 10 including the active region 16 and the STI region 17. After that, from the top of the silicon oxide film 14, for example, boron as impurities is introduced by the ion injection method. Introduction is carried out down to a region deeper than the bottom of the groove 12 from the surface of the silicon substrate 10. Due to this, in the active region 16, boron is introduced into the silicon substrate 10 from the top face of the silicon substrate 10 down to the depth corresponding to the region deeper than the bottom of the groove 12. In the STI region 17, boron is introduced into the silicon substrate 10 from the bottom face of the groove 12 down to a region deeper than the bottom of the groove 12. The portion of the silicon substrate 10 into which boron is introduced forms the p-type well 15.

As shown in FIG. 13 to FIG. 16, by the processes described above, the STI region 17 extending in parallel with one direction is formed on the silicon substrate 10. Then, the active region 16 is formed so as to be arranged between the STI regions 17. On the surface of the silicon substrate 10, the silicon oxide film 14 is formed, however, in FIG. 13, its schematic representation is omitted.

Figure 17:
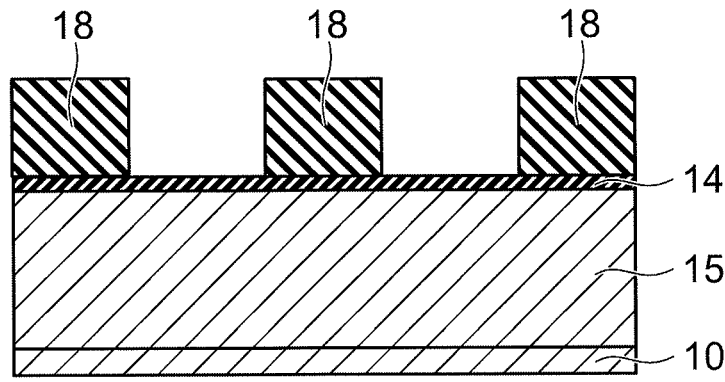
FIG. 17 is a process sectional view illustrating the method for manufacturing the semiconductor device according to the fourth embodiment.

Next, as shown in FIG. 17, on the section corresponding to the section along the B-B' line in FIG. 13, after forming, for example, an SiN film as a film that is formed into a hard mask 18 on the silicon substrate 10, the hard mask 18 is formed by patterning the film by the photolithography method etc. The hard mask 18 extends in a direction perpendicular to the groove 12 to form the STI region 17.

Figure 18:
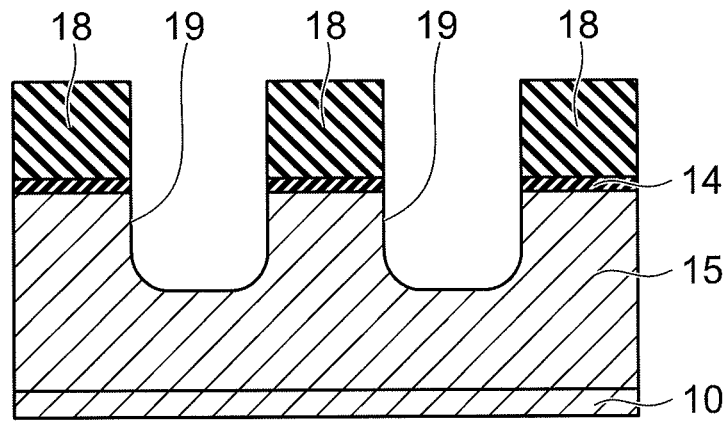
FIG. 18 is a process sectional view illustrating the method for manufacturing the semiconductor device according to the fourth embodiment.

Next, as shown in FIG. 18, by performing reactive ion etching using the hard mask 18 as a mask, the silicon oxide film 14 and the silicon substrate 10 are removed selectively. Due to this, the groove 19 is formed.

Figure 19:
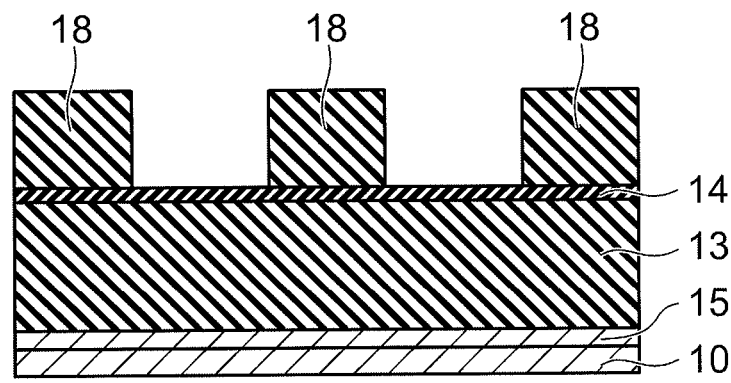
FIG. 19 is a process sectional view illustrating the method for manufacturing the semiconductor device according to the fourth embodiment.

Further, as shown in FIG. 19, on the section corresponding to the section along the C-C' line in FIG. 13, in the STI region 17 also, after forming an SiN film as a film that is formed into the hard mask 18 on the silicon substrate 10, the hard mask 18 is formed by patterning the film by the lithography method etc.

Figure 20:
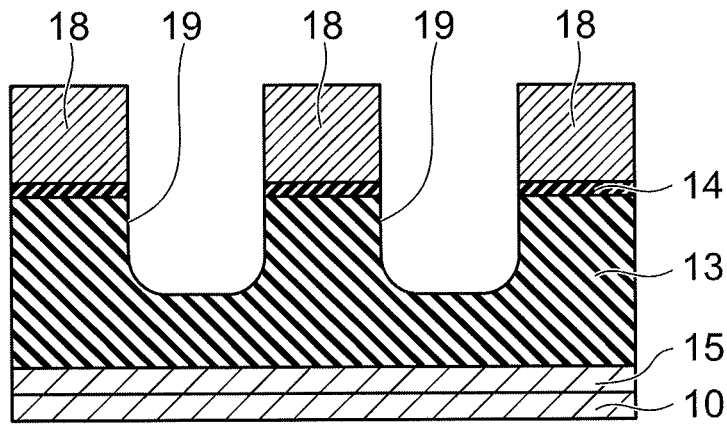
FIG. 20 is a process sectional view illustrating the method for manufacturing the semiconductor device according to the fourth embodiment.

Next, as shown in FIG. 20, by reactive ion etching using the hard mask 18 as a mask, the silicon oxide film 13 and the silicon oxide film 14 are removed selectively. Due to this, the groove 19 is formed.

As described above, the interior of the groove 19 in the active region along the B-B' line shown in FIG. 13 and the interior of the groove 19 in the STI region along the C-C' line shown in FIG. 13 have the same configuration. Thus, hereinafter, only the process sectional views in the active region are shown.

Figure 21:
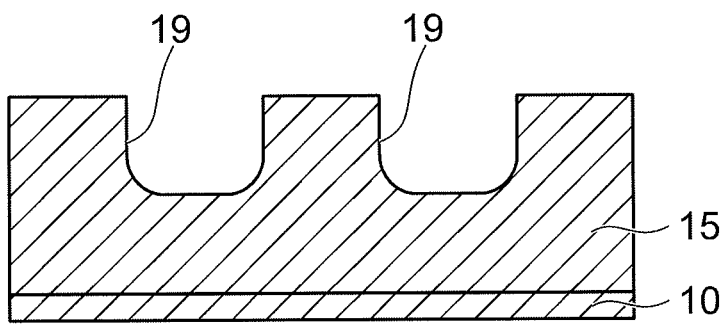
FIG. 21 is a process sectional view illustrating the method for manufacturing the semiconductor device according to the fourth embodiment.

Next, as shown in FIG. 21, the hard mask 18 and the silicon oxide film 14 on the silicon substrate 10 are removed.

Figure 22:
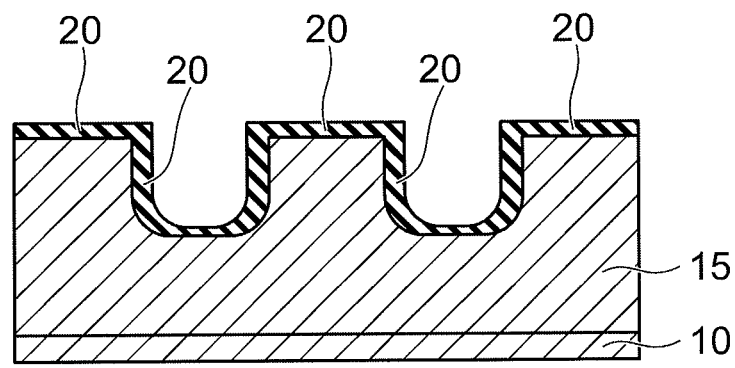
FIG. 22 is a process sectional view illustrating the method for manufacturing the semiconductor device according to the fourth embodiment.

After that, as shown in FIG. 22, the silicon oxide film 20 that is formed into a gate insulating layer is formed on the inner face of the groove 19 and on the top face of the silicon substrate 10.

Figure 23:
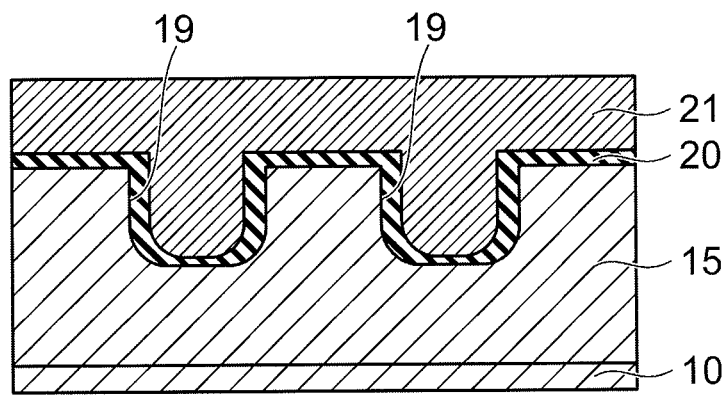
FIG. 23 is a process sectional view illustrating the method for manufacturing the semiconductor device according to the fourth embodiment.

Next, as shown in FIG. 23, a polysilicon film 21 that is formed into part of the gate electrode is formed from the top of the silicon oxide film 20. Into the polysilicon film, phosphorus is introduced as impurities. The polysilicon film 21 is formed so as to fill in the inside of the groove 19.

Figure 24:
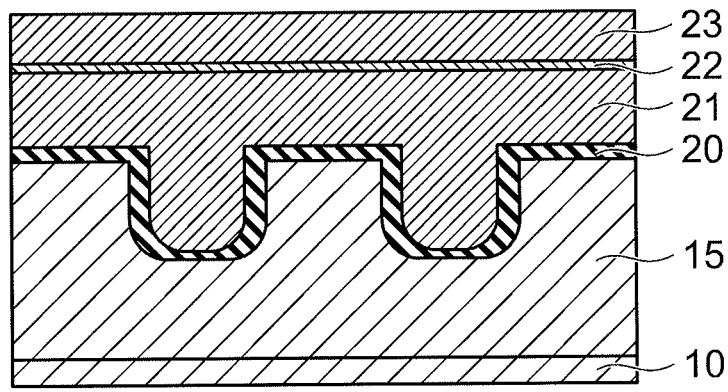
FIG. 24 is a process sectional view illustrating the method for manufacturing the semiconductor device according to the fourth embodiment.

After that, as shown in FIG. 24, a stacked film of, for example, titanium and titanium nitride is stacked as the barrier metal layer 22 from the top of the polysilicon film 21. Then, for example, a tungsten (W) film is formed as the low-resistance metal layer 23 from the top thereof. In the embodiment, the gate electrode includes the polysilicon film 21, the barrier metal layer 22, and the low-resistance metal layer 23. As a material of the barrier metal layer 22, mention is made of titanium nitride in addition to the stacked film of titanium and titanium nitride.

Figure 25:
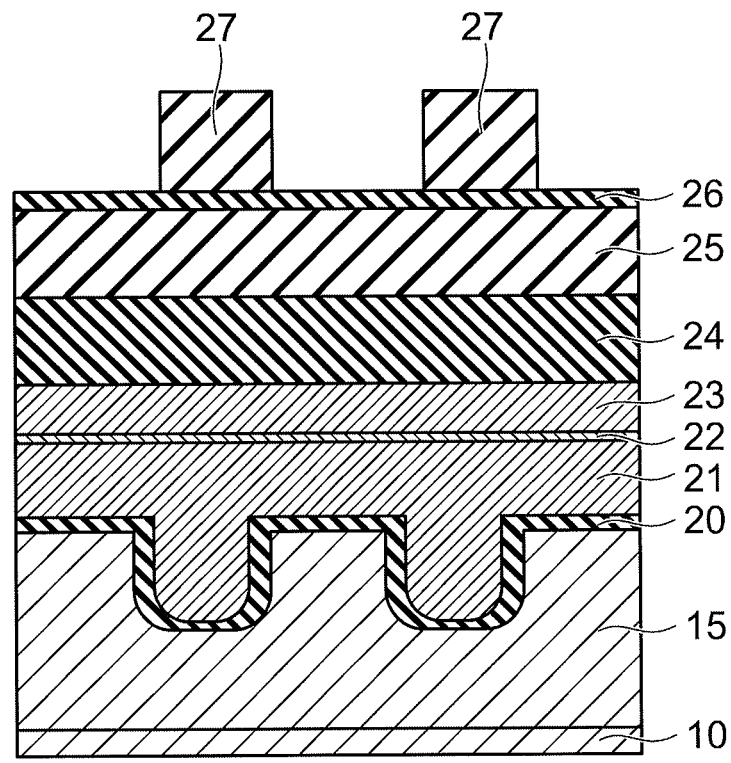
FIG. 25 is a process sectional view illustrating the method for manufacturing the semiconductor device according to the fourth embodiment.

Then, as shown in FIG. 25, after forming a silicon nitride film 24 and an organic film 25 from the top of the low-resistance metal layer 23, a silicon oxide film 26 is formed thereon. Further, on the silicon oxide film 26, a resist 27 is formed. At this time, the aim is to form the resist 27 in a region that agrees with the region immediately above the groove 19. However, due to the deviation in alignment of lithography, there may be a case where there is produced a deviation between these positions. However, the amount of the deviation is within a rage estimated from the precision of the lithography method and less than the width of the groove 19. Consequently, the resist 27 is formed in a region including part of the region immediately above the groove 19.

Next, using the resist 27 as a mask, the silicon oxide film 26 is patterned.

Figure 26:
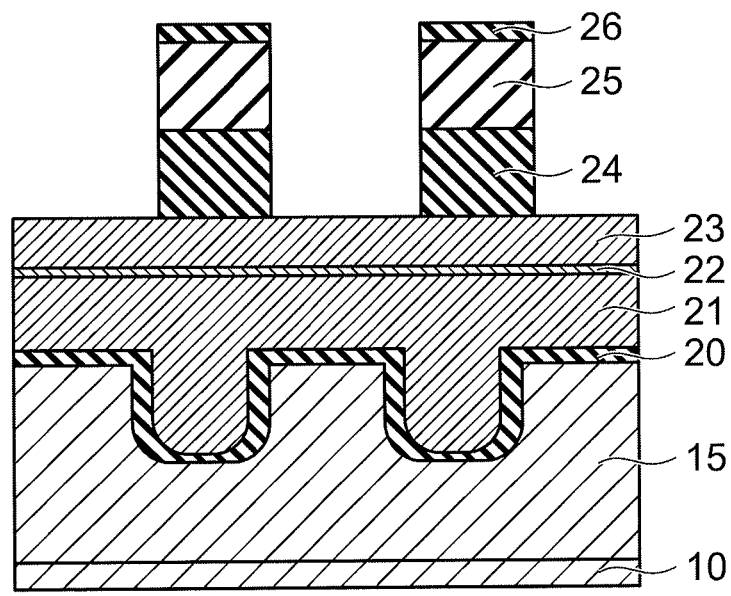
FIG. 26 is a process sectional view illustrating the method for manufacturing the semiconductor device according to the fourth embodiment.

After that, as shown in FIG. 26, using the patterned silicon oxide film 26 as a mask, the organic film 25 and the silicon nitride film 24 are processed. The deviation with the same width as the deviation in alignment between the groove 19 and the resist 27 is produced between the groove 19 and the silicon oxide film 26 and between the organic film 25 and the silicon nitride film 24.

Figure 27:
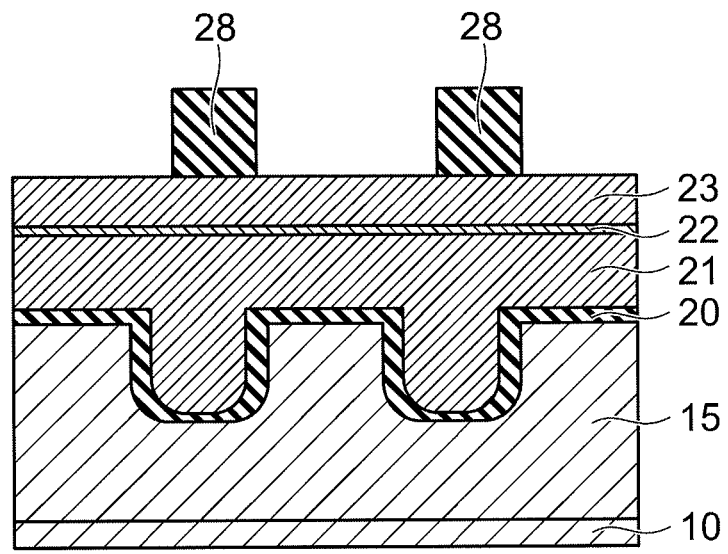
FIG. 27 is a process sectional view illustrating the method for manufacturing the semiconductor device according to the fourth embodiment.

As shown in FIG. 27, in the embodiment, the silicon oxide film 26 and the organic film 25 are removed and the patterned silicon nitride film 24 is used as the hard mask 28.

Figure 28:
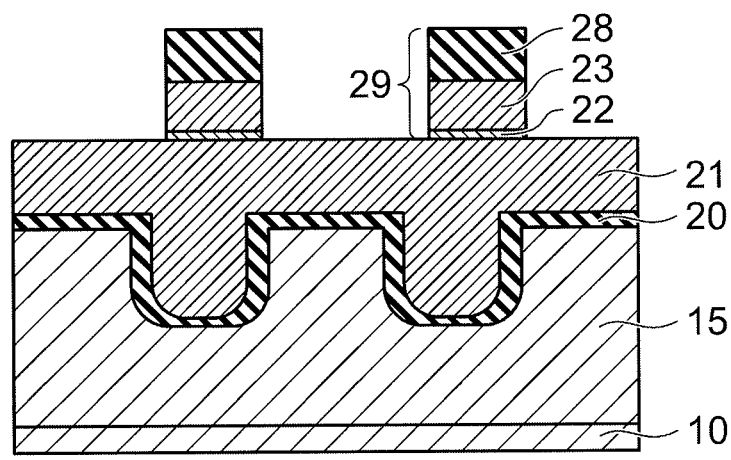
FIG. 28 is a process sectional view illustrating the method for manufacturing the semiconductor device according to the fourth embodiment.

Next, as shown in FIG. 28, using the hard mask 28 as a mask, reactive ion etching is performed and the low-resistance metal layer 23 and the barrier metal layer 22 are removed selectively. Thereby, in the portion covered with the hard mask 28, part of the gate electrode including the low-resistance metal layer 23 and the barrier metal layer 22 is formed.

On the other hand, on the surface of the portion not covered with the hard mask 28, the polysilicon film 21 appears.

When a stacked film of titanium nitride and titanium is used as the barrier metal layer 22, there is a possibility that titanium is oxidized and deteriorated at the time of post oxidation after the gate electrode processing.

Figure 29:
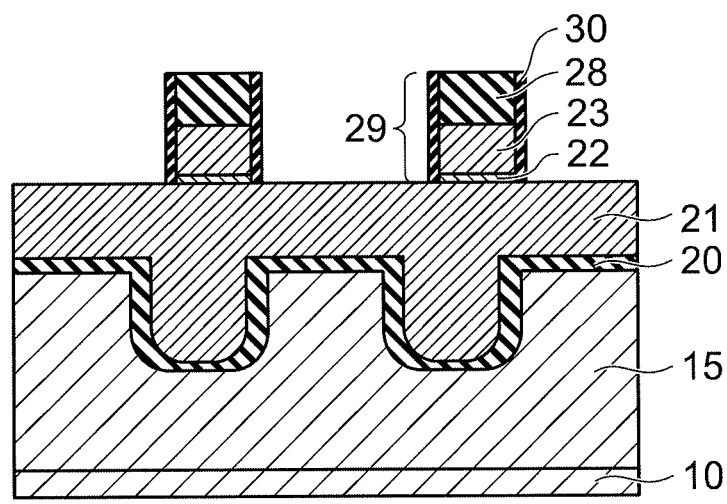
FIG. 29 is a process sectional view illustrating the method for manufacturing the semiconductor device according to the fourth embodiment.

Hence, as shown in FIG. 29, the barrier metal sidewall 30 is formed on the side face of the multilayer film including the hard mask 28, the low-resistance metal layer 23, and the barrier metal layer 22. As a material of the barrier metal sidewall 30, mention is made, for example, of a silicon nitride film. The barrier metal sidewall 30 is formed by removing, after forming a silicon nitride film by the CVD (Chemical Vapor Deposition) method etc., the portion other than that on the side face of the multilayer film including the hard mask 28, the low-resistance metal layer 23, and the barrier metal layer 22.

When the barrier metal sidewall 30 is formed, the multilayer film including the barrier metal sidewall 30, the hard mask 28, the low-resistance metal layer 23, and the barrier metal layer 22 is referred to as the columnar body 29. When the barrier metal sidewall 30 is not formed, the multilayer film including the hard mask 28, the low-resistance metal layer 23, and the barrier metal layer 22 is referred to as the columnar body 29.

Figure 30:
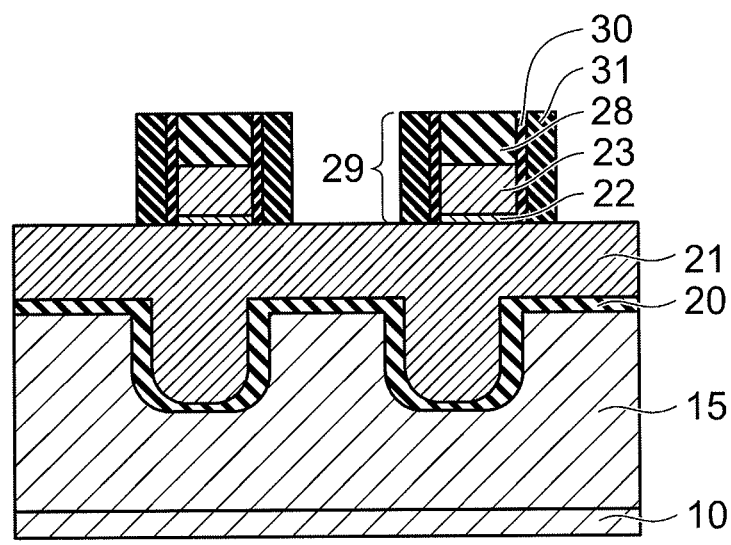
FIG. 30 is a process sectional view illustrating the method for manufacturing the semiconductor device according to the fourth embodiment.

Next, as shown in FIG. 30, an electrode processing sidewall 31 is formed on the side face of the barrier metal sidewall 30. The electrode processing sidewall 31 is formed by a film containing carbon. As a method for forming a film containing carbon, mention is made of a forming method using a film deposition method such as the CVD method etc. and a forming method using a reactive product at the time of etching. In the method using the CVD method etc., first a film containing carbon, hydrogen, and nitrogen is formed on the silicon substrate 10. It is also possible to form a film the carbon content of which is nearly 100%. After forming a film containing carbon, hydrogen, and nitrogen, the electrode processing sidewall 31 is formed by removing the portion other than that on the sidewall of the columnar body 29. In the forming method using a reactive product at the time of etching, on a fluorocarbon film formed by a reactive product at the time of etching on the silicon substrate 10, the portion other than that on the sidewall of the columnar body 29 is removed and thus the electrode processing sidewall 31 is formed. The thickness of the electrode processing sidewall 31 on the side face of the barrier metal sidewall 30 is made to have a film thickness greater than the width of deviation in alignment estimated between the position of the groove 19 and the position of the hard mask 28.

Next, the polysilicon film 21 is processed. In the embodiment, the gate electrode has a three-layer structure of the polysilicon film 21, the barrier metal layer 22, and the low-resistance metal layer 23. Consequently, the polysilicon film 21 is the lowermost layer film of the gate electrode.

Figure 31:
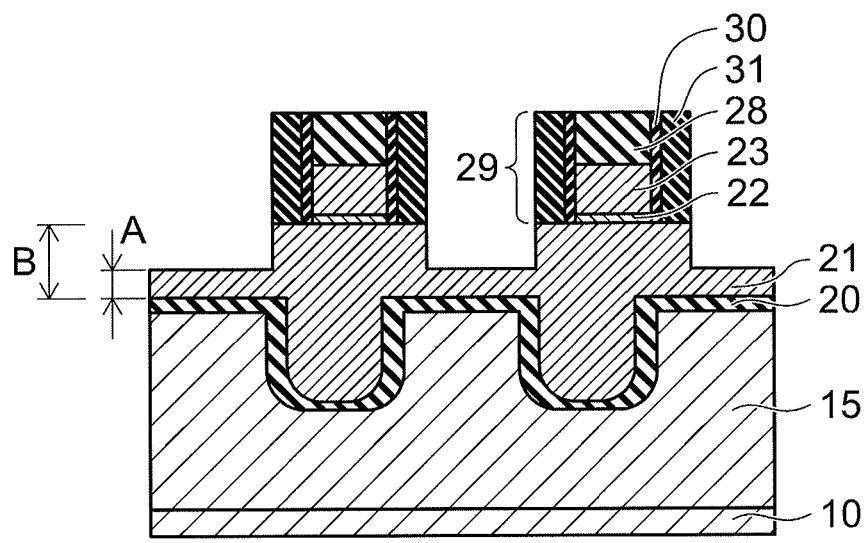
FIG. 31 is a process sectional view illustrating the method for manufacturing the semiconductor device according to the fourth embodiment.

As shown in FIG. 31, the polysilicon film 21 is etched using the electrode processing sidewall 31 and the columnar body 29 as a mask. Thereby, the polysilicon film 21 between the gate electrodes is etched, but the polysilicon film 21 covered with the electrode processing sidewall 31 is not etched.

Then, the removal of the polysilicon film 21 between the gate electrodes is temporarily stopped on the way of etching before it is completely removed. By the temporary stop, the thickness of the polysilicon film 21 covered with the electrode processing sidewall 31 is left greater than the thickness of the polysilicon film 21 between the gate electrodes. It is designed so that the polysilicon film 21 covered with the electrode processing sidewall 31 is removed during the over-etching performed to make insulation between the gate electrodes perfect. Consequently, the lower conductive part 41 is not etched even if there is produced a deviation between the position of the groove 19 and the position of the gate electrode.

Next, the thickness of the polysilicon film 21 when etching is temporarily stopped on the way is explained.

As shown in FIG. 31, when a thickness A of the polysilicon film 21 between the gate electrodes, that is, the portion of the polysilicon film 21 above the silicon substrate 10 where the groove 19 is not provided is reduced to a thickness represented by the following expression (1), etching is stopped temporarily on the way.

$$A = B - (B \cdot X / 100) \tag{1}$$

Here, B represents a thickness of the portion of the polysilicon film 21 above the silicon substrate 10 where the groove 19 is not formed before the formation of the electrode processing sidewall 31. X represents an amount of over-etching, in units of %. The amount of over-etching is an amount of etching performed additionally to make insulation between gate electrodes perfect even when the polysilicon film is removed above the surface of the silicon substrate 10.

The less X is, the less the cost is. However, it is preferable for the amount of over-etching to be, for example, 30% or more in view of the variations in the thickness of the polysilicon film 21 and the aim of forming insulation between the gate electrodes. In order to reduce the manufacturing cost while increasing yields of the transistor by improving insulation between the gate electrodes, it is preferable for the amount of over-etching to be about 50%.

For example, when the thickness of the polysilicon film 21 above the silicon substrate 10 where the groove 19 is not formed before the formation of the electrode processing sidewall 31 is 100 nm, if the amount of over-etching is 30%, $$100-(100\cdot 30/100)=70.$$

This means that etching of the polysilicon film 21 is stopped temporarily when the thickness A of the portion of the polysilicon film 21 above the silicon substrate 10 where the groove 19 is not provided is reduced to 70 nm and the electrode processing sidewall 31 is removed.

Further, for example, if the amount of over-etching is 50%, $$100-(100\cdot 50/100)=50.$$

This means that etching of the polysilicon film 21 is stopped temporarily when the thickness A of the portion of the polysilicon film 21 above the silicon substrate 10 where the groove 19 is not provided is reduced to 50 nm and the electrode processing sidewall 31 is removed.

Figure 32:
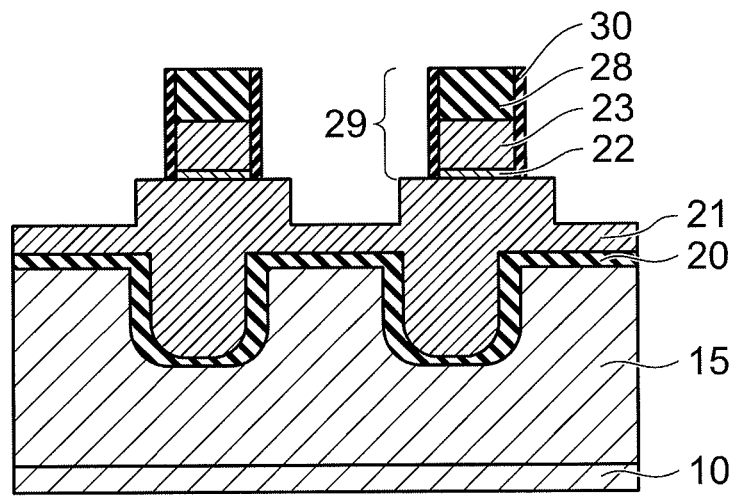
FIG. 32 is a process sectional view illustrating the method for manufacturing the semiconductor device according to the fourth embodiment.

Then, as shown in FIG. 32, etching is resumed and when the thickness of the polysilicon film 21 is reduced to the thickness found by the expression (1), etching is stopped temporarily. Then, etching using a gas containing an oxygen gas is performed and the electrode processing sidewall 31 is removed. In this stage, the polysilicon film 21 in the region covered with the electrode processing sidewall 31 is left thick and the polysilicon film 21 between the gate electrodes outside thereof is left thin.

Figure 33:
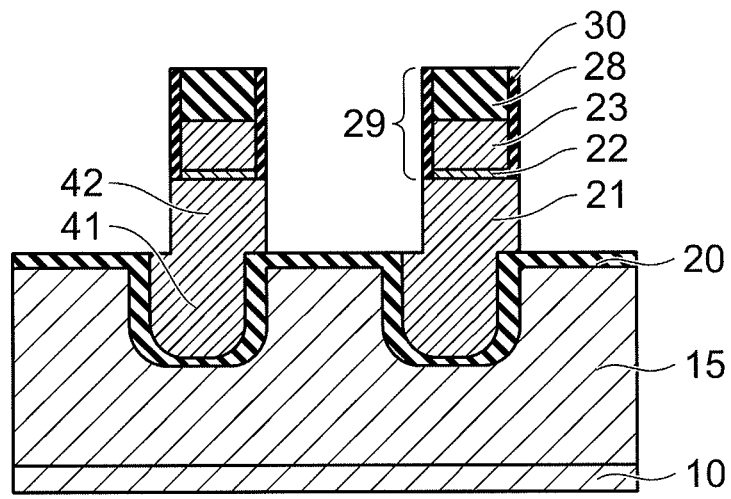
FIG. 33 is a process sectional view illustrating the method for manufacturing the semiconductor device according to the fourth embodiment.

Next, as shown in FIG. 33, the portion of the polysilicon film 21, which is covered with the electrode processing sidewall 31, and the portion formed between the gate electrodes are removed. Even after the portion of the polysilicon film 21 between the gate electrodes is removed and the silicon oxide film 20 appears on the surface, etching corresponding to the set amount of over-etching is continued. Consequently, the portion covered with the electrode processing sidewall 31 is also removed, but it is unlikely that the portion embedded within the groove 19 in the polysilicon film 21 is etched and scraped out. This is because the amount of over-etching X is taken into account in advance so that etching of just the thickness B of the polysilicon film 21 of the portion covered with the electrode processing sidewall 31 is performed and the thickness A of the polysilicon film 21 between the gate electrodes is set to be left by the expression (1).

Figure 34:
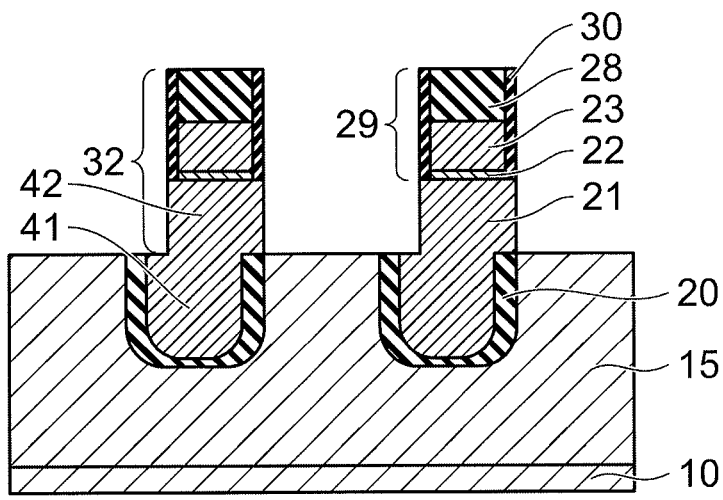
FIG. 34 is a process sectional view illustrating the method for manufacturing the semiconductor device according to the fourth embodiment.

After that, as shown in FIG. 34, the silicon oxide film 20 on the silicon substrate 10 between the gate electrodes, that is, the silicon oxide film 20 other than the silicon oxide film 20 on the inner wall of the groove 19, which is formed into a gate insulating layer, is removed. Within the groove 19, the silicon oxide film 20 is left.

A stacked film including the columnar body 29 and the upper conductive part 42 is referred to as the columnar body 32.

Figure 35:
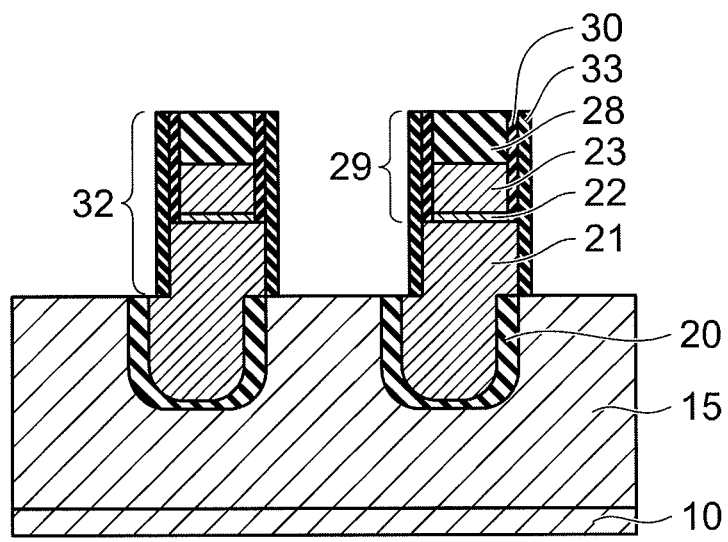
FIG. 35 is a process sectional view illustrating the method for manufacturing the semiconductor device according to the fourth embodiment.

Next, as shown in FIG. 35, the extension sidewall 33 is formed on the side face of the columnar body 32. The extension sidewall 33 is formed by forming a silicon nitride film on the silicon substrate 10 and then removing the portion other than that on the side face of the columnar body 32.

Figure 36:
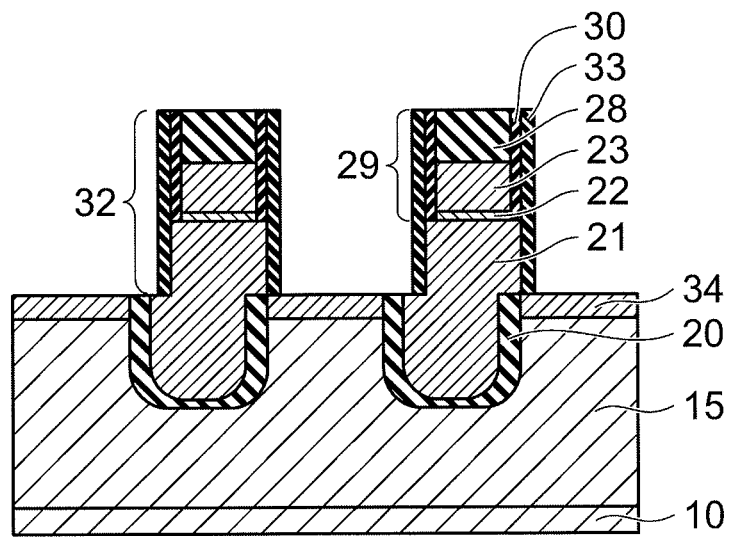
FIG. 36 is a process sectional view illustrating the method for manufacturing the semiconductor device according to the fourth embodiment.

Then, as shown in FIG. 36, phosphorus ions are injected into the silicon substrate 10 using the columnar body 32 and the extension sidewall 33 as a mask. Thereby, the extended region 34 is formed in a region of the silicon substrate 10, which is not covered with the columnar body 32 or the extension sidewall 33.

Figure 37:
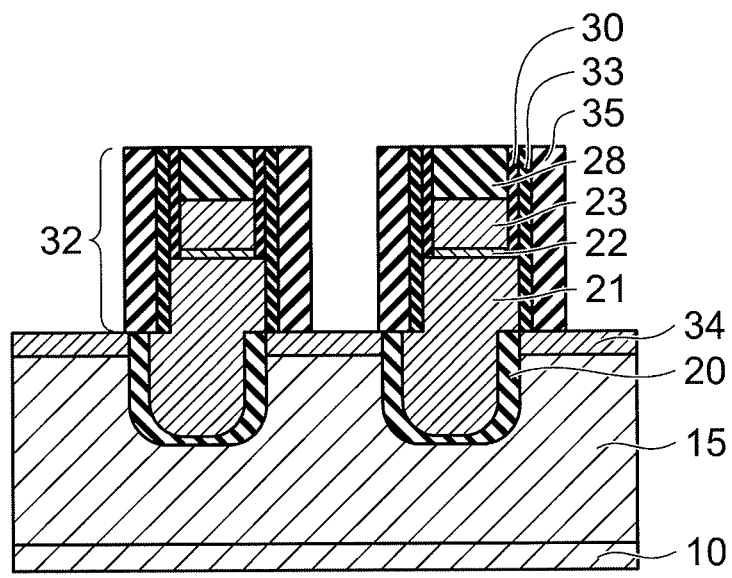
FIG. 37 is a process sectional view illustrating the method for manufacturing the semiconductor device according to the fourth embodiment.

Further, as shown in FIG. 37, the source/drain sidewall 35 is formed on the side face of the columnar body 32.

Figure 38:
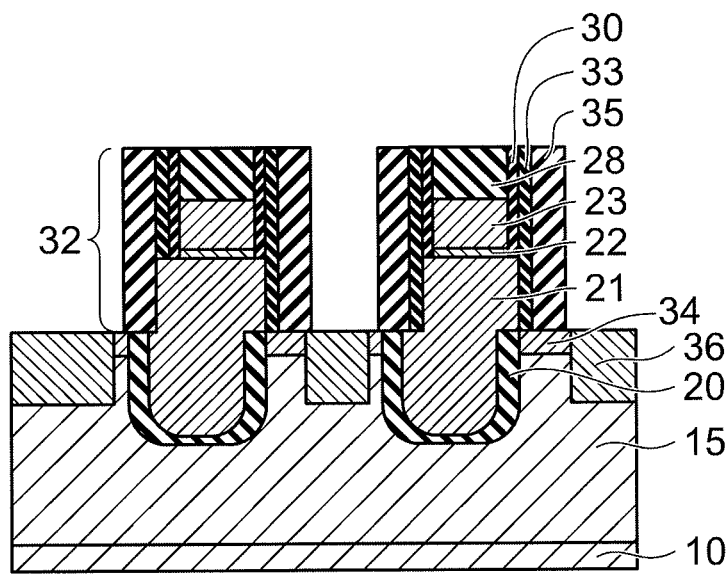
FIG. 38 is a process sectional view illustrating the method for manufacturing the semiconductor device according to the fourth embodiment.

Then, as shown in FIG. 38, phosphorus ions are injected into the silicon substrate 10 using the columnar body 32, the extension sidewall 33, and the source/drain sidewall 35 as a mask. Thereby, the source/drain region 36 is formed in a region of the silicon substrate 10, which is not covered with the columnar body 32, the extension sidewall 33, or the source/drain sidewall 35. Into the source/drain region 36, phosphorus is injected in a concentration higher than that when it is injected into the extended region 34. Further, into the source/drain region 36, phosphorus is injected deeper than the extended region 34.

Then, the surface of the source/drain region 36 is turned into silicide by heating after depositing nickel. Next, nickel not reacted is removed. Then, after depositing the interlayer insulating layer 37 on the silicon substrate 10, the contact hole 38 that reaches the source/drain region is formed in the interlayer insulating layer 37. The contact 39 is formed by embedding a conductive member within the contact hole.

In this manner, the semiconductor device 1 is completed as shown in FIG. 1 and FIG. 2.

Next, the effect of the method for manufacturing a semiconductor device according to the fourth embodiment is explained.

In the recessed channel transistor, the gate electrode is formed within and immediately above the groove 19. To this end, the resist 27 used to process the top part of the gate electrode is arranged so as to agree with the position of the groove 19. However, in actuality, due to the deviation in alignment of lithography, there is produced a deviation between the position of the groove 19 and the position of the resist 27 in many cases. In the method for manufacturing a semiconductor device according to the embodiment, the margin portion of the polysilicon film 21, the length of which is the estimated length of deviation, is formed on the side face of the gate electrode and the margin portion is removed by over-etching.

Consequently, even when there is produced a deviation, it is possible to suppress etching of the lower conductive part 41 of the recessed channel transistor. Therefore, it is possible to suppress deterioration in the characteristics of the transistor.

As the material of electrode processing sidewall 31, if a material containing carbon is used, it is possible to easily form and remove the electrode processing sidewall 31 because of the relationship of the etching rate of the material of the hard mask, the barrier metal sidewall, the element isolation region, and the gate insulating layer. Consequently, in the embodiment, it is possible to realize a recessed channel transistor and provide a semiconductor device capable of aiming at high integration.

Comparative Example of Fourth Embodiment

Next, a comparative example of the fourth embodiment is explained.

The comparative example is a method for manufacturing a semiconductor device when the electrode processing sidewall 31 is not formed.

The processes shown in FIG. 5 to FIG. 29 in the fourth embodiment are the same as those also in the comparative example, and therefore, their explanation is omitted.

Figure 39:
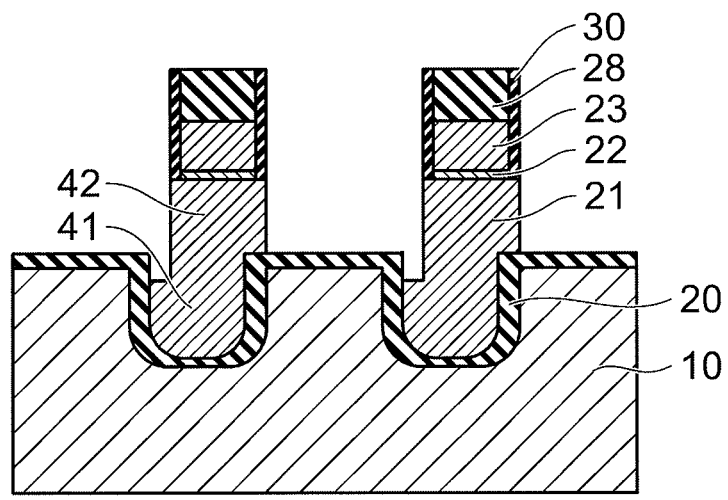
FIG. 39 is a process sectional view illustrating a method for manufacturing a semiconductor device according to the comparative example of the fourth embodiment.

FIG. 39 is a process sectional view illustrating a method for manufacturing a semiconductor device according to the comparative example of the fourth embodiment.

As shown in FIG. 39, in the comparative example, the polysilicon film 21 is etched without forming the electrode processing sidewall 31. If over-etching is performed in order to make insulation between the gate electrodes perfect, there is produced a deviation between the groove 19 and the gate electrode, and therefore, part of the lower conductive part 41 is also removed.

After that, the silicon oxide film 20 between the gate electrodes, that is, the silicon oxide film 20 other than the silicon oxide film 20 on the inner wall of the groove 19, which is formed into a gate insulating layer, is removed. Then, by performing the processes as shown in FIGS. 35 to 38 in the fourth embodiment, a semiconductor device is manufactured.

In the semiconductor device according to the comparative example, a fracture is produced in the lower conductive part 41. When this fracture is deeper than the bottom of source/drain region, the performance of the recessed channel transistor is not exhibited sufficiently.

Fifth Embodiment

Next, a fifth embodiment is explained.

The embodiment is an embodiment of a method for manufacturing the semiconductor device according to the second embodiment.

In the embodiment, different from the fourth embodiment, after the polysilicon film 21 having a thickness not less than the thickness found by the expression (1) is removed, the electrode processing sidewall 31 is removed.

Hereinafter, the embodiment is explained with reference to the drawings.

FIG. 40 to FIG. 43 are process sectional views illustrating the method for manufacturing a semiconductor device according to the fifth embodiment.

First, as in the fourth embodiment described above, the processes shown in FIG. 5 to FIG. 30 are performed. Explanation of these processes is omitted.

Figure 40:
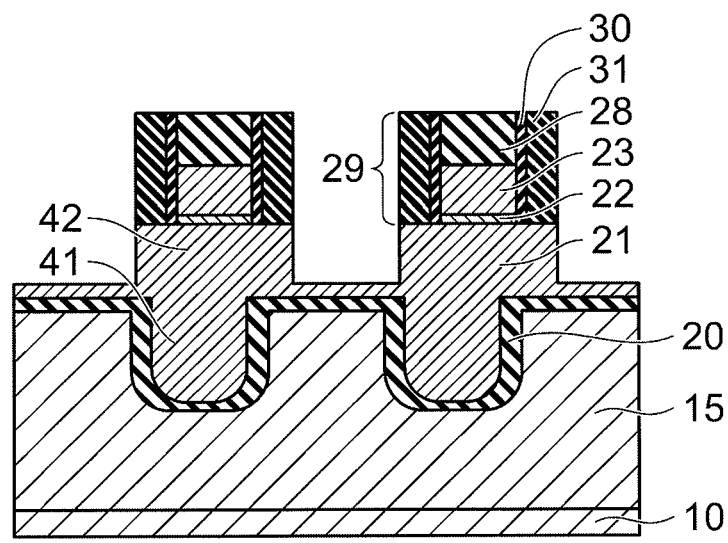
FIG. 40 is a process sectional view illustrating a method for manufacturing a semiconductor device according to a fifth embodiment.

As shown in FIG. 40, in the embodiment, after removing the polysilicon film 21 using the electrode processing sidewall 31 and the columnar body 29 as a mask until the thickness of the polysilicon film 21 is reduced less than the thickness found by the expression (1), etching is stopped temporarily.

Figure 41:
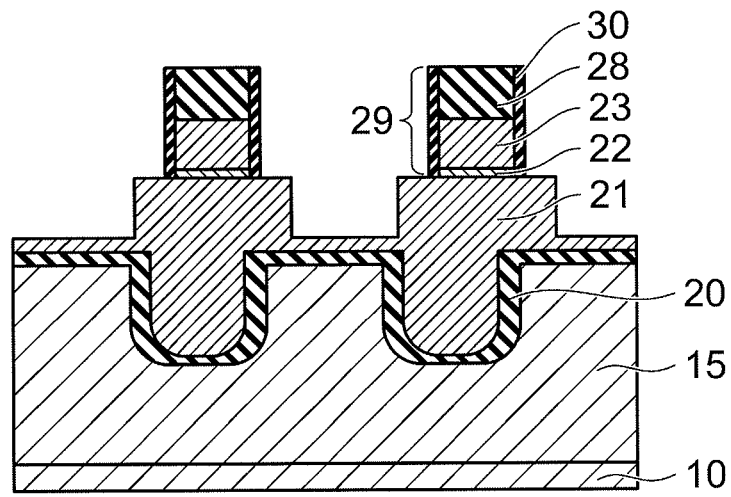
FIG. 41 is a process sectional view illustrating the method for manufacturing the semiconductor device according to the fifth embodiment.

Next, as shown in FIG. 41, the electrode processing sidewall 31 is removed by etching using a gas containing oxygen. In this stage, the polysilicon film 21 in the region covered with the electrode processing sidewall 31 is left thick and the polysilicon film 21 in the region between the gate electrodes outside thereof is left thinner than in the case of the fourth embodiment.

Figure 42:
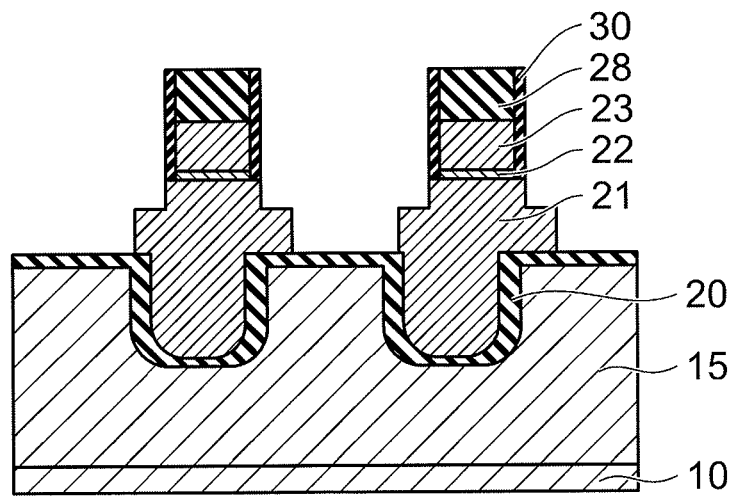
FIG. 42 is a process sectional view illustrating the method for manufacturing the semiconductor device according to the fifth embodiment.

Next, as shown in FIG. 42, etching is resumed and the polysilicon film 21 covered with the electrode processing sidewall 31 and the polysilicon film 21 between the gate electrodes are removed using the columnar body 29 as a mask. Even after the polysilicon film 21 between the gate electrodes is removed and the silicon oxide film 20 appears on the surface, etching corresponding to the set amount of over-etching is continued. In the fifth embodiment, the polysilicon film 21 covered with the electrode processing sidewall 31 is left. Then, a step is formed on the side face of the upper conductive part 42.

Figure 43:
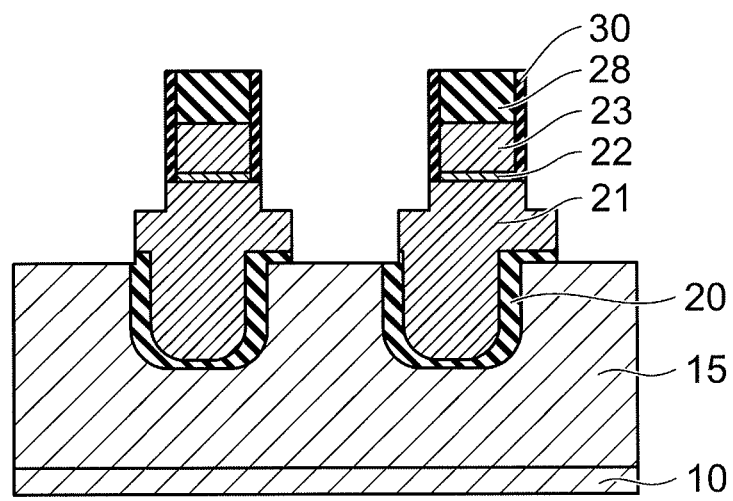
FIG. 43 is a process sectional view illustrating the method for manufacturing the semiconductor device according to the fifth embodiment.

After that, as shown in FIG. 43, the silicon oxide film 20 between the gate electrodes, that is, the silicon oxide film 20 of the portion other than the silicon oxide film 20 on the inner wall of the groove 19, which is formed into a gate insulating layer, is removed. Within the groove 19, the silicon oxide film 20 is left.

Then, as in the fourth embodiment, the processes as shown in FIG. 35 to FIG. 38 are performed.

In this manner, a semiconductor device 2 is manufactured as shown in FIG. 3.

Next, the effect of the method for manufacturing a semiconductor device according to the fifth embodiment is explained.

In the embodiment, the polysilicon film 21 of the portion covered with the electrode processing sidewall 31 is left. Consequently, the width of the gate electrode is greater than that in the fourth embodiment. However, even if there is produced a deviation between the position of the groove 19 and the position of the hard mask 28 and there is produced a deviation between the set value of an amount of over-etching X and the actual amount of etching, it is possible to cover the region immediately above the groove 19 with the polysilicon film 21 of the gate electrode without fail. Hence, it is possible to suppress etching of the lower conductive part 41.

The effects other than that described above in the embodiment are the same as those in the fourth embodiment described above.

Six Embodiment

Next, a sixth embodiment is explained.

The embodiment is an embodiment of a method for manufacturing the semiconductor device according to the third embodiment.

In the embodiment, different from the fourth embodiment, when performing etching using the electrode processing sidewall 31 and the columnar body 29 as a mask, the electrode processing sidewall 31 is removed after removing all the portions of the polysilicon film 21, which are not covered with the mask, and exposing the silicon oxide film 20 between the gate electrodes on the surface.

Hereinafter, the embodiment is explained with reference to the drawings.

Figure 44:
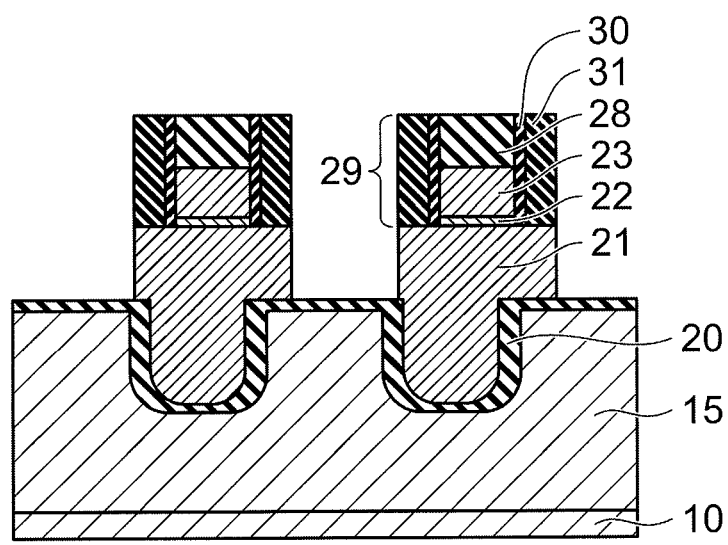
FIG. 44 is a process sectional view illustrating a method for manufacturing a semiconductor device according to a sixth embodiment.
Figure 45:
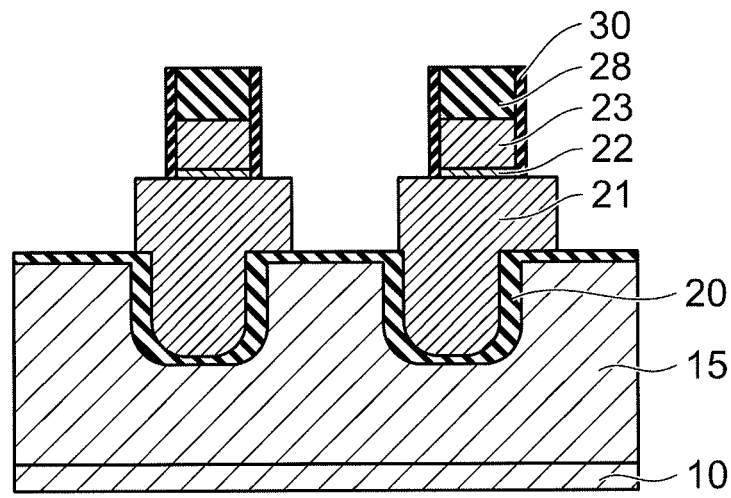
FIG. 45 is a process sectional view illustrating the method for manufacturing the semiconductor device according to the sixth embodiment.
Figure 46:
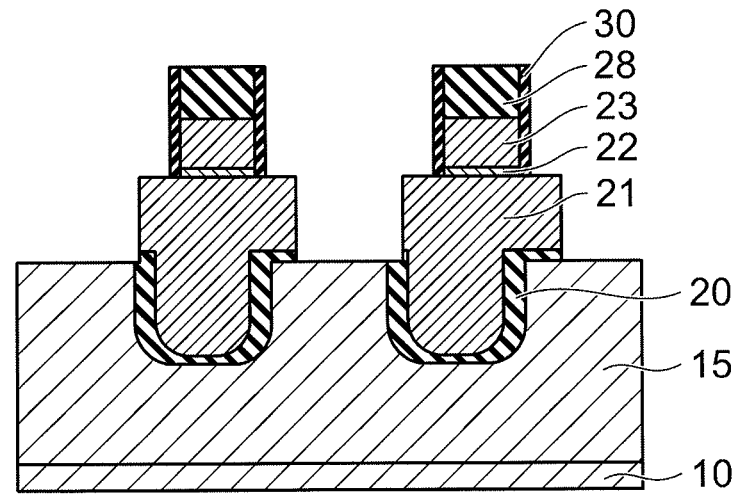
FIG. 46 is a process sectional view illustrating the method for manufacturing the semiconductor device according to the sixth embodiment.

FIG. 44 to FIG. 46 are process sectional views illustrating the method for manufacturing a semiconductor device according to the sixth embodiment.

First, as in the fourth embodiment described above, the processes shown in FIG. 5 to FIG. 26 are performed. Explanation of these processes is omitted.

As shown in FIG. 44, in the embodiment, the polysilicon film 21 is removed using the electrode processing sidewall 31 and the columnar body 29 as a mask until the silicon oxide film 20 appears on the surface of the silicon substrate 10 between the gate electrodes.

After that, as shown in FIG. 45, the electrode processing sidewall 31 is removed by etching using a gas containing oxygen. In this stage, the polysilicon film 21 in the region covered with the electrode processing sidewall 31 is left thick and the polysilicon film 21 in the region between the gate electrodes outside thereof is removed and the silicon oxide film 20 formed on the silicon substrate 10 appears on the surface.

Next, as shown in FIG. 46, the silicon oxide film 20 that appears on the surface is removed.

Then, as in the fourth embodiment, the processes as shown in FIG. 35 to FIG. 38 are performed.

In this manner, a semiconductor device 3 is manufactured as shown in FIG. 4.

Next, the effect of the semiconductor device according to the sixth embodiment is explained.

In the embodiment, in the process shown in FIG. 44, after the whole portion of the polysilicon film 21, which is not covered with the columnar body 29 or the electrode processing sidewall 31, is removed, the electrode processing sidewall 31 is removed in the process shown in FIG. 45. Hence, regardless of the amount of over-etching of the polysilicon film 21, it is possible to leave the polysilicon film 21 in the region immediately above the groove 19 without fail. Consequently, it is not necessary to take the amount of over-etching X into consideration as in the fourth embodiment. Further, it is possible to perform processing of the polysilicon film 21 by one-time etching processing. Therefore, the process is simple. On the other hand, in the fourth embodiment, it is possible to form the conductive part 43 of the gate electrode thinner compared to that in the embodiment, and therefore, it is possible to further miniaturize the semiconductor device.

The effects of the embodiment other than that described above are the same as those of the fourth and fifth embodiments described above.

According to the embodiments explained above, it is possible to provide a method for manufacturing a semiconductor device capable of aiming at high integration.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A method for manufacturing a semiconductor device, the method comprising:
    forming a plurality of grooves extending in a first direction on a semiconductor substrate;
    forming an insulating layer on an inner face of the plurality of grooves and on a top face of the semiconductor substrate;
    depositing a first conductive layer on the insulating layer so as to fill in the plurality of grooves;
    depositing a second conductive layer on the first conductive layer;
    forming a hard mask in a region, including part of a region immediately above at least one of the plurality of grooves, on the second conductive layer;
    forming a columnar body including the hard mask and the second conductive layer by etching the second conductive layer using the hard mask as a mask;
    forming an electrode processing sidewall on two side faces, facing each other in a width direction of the at least one of the plurality of grooves, of the columnar body;
    removing an upper part of exposed portion in the first conductive layer and leaving a lower part of the exposed portion by performing etching using the columnar body and the electrode processing sidewall as a mask;
    removing the electrode processing sidewall; and
    removing the lower part of the exposed portion by performing etching using the columnar body as a mask.

2. The method according to claim 1, wherein
    when the total thickness of the upper part and the lower part is assumed to be t and an amount of over-etching of the first conductive layer is assumed to be A represented by percent, the thickness of the lower part is $\{t-(t\cdot A/100)\}$.

3. The method according to claim 1, wherein
    the thickness of the electrode processing sidewall is set not less than an estimated length of deviation between a position of the at least one of the plurality of grooves and a position of the hard mask.

4. The method according to claim 1, wherein
    the material of the electrode processing sidewall contains carbon.

5. The method according to claim 4, wherein
    forming the electrode processing sidewall includes:
        forming a film containing carbon on the semiconductor substrate by the chemical vapor deposition method using a gas containing carbon, nitrogen, and hydrogen; and
        removing a portion formed on other than the two side faces in the film containing carbon.

6. The method according to claim 1, wherein
    forming the columnar body includes forming a barrier metal sidewall on two side faces, facing each other in the width direction of the at least one of the plurality of grooves, of the hard mask and the second conductive layer after etching the second conductive layer so that the columnar body includes the barrier metal sidewall.

7. The method according to claim 6, wherein
    the hard mask and the barrier metal sidewall are formed by silicon nitride.

8. The method according to claim 1, wherein
    the second conductive layer is formed into a multilayer film.

9. The method according to claim 1, further comprising, before the forming the plurality of grooves extending in the first direction on the semiconductor substrate, forming a plurality of element isolation regions extending in a direction intersecting the first direction on the top face of the semiconductor substrate.

10. The method according to claim 1, further comprising:
    forming a source/drain sidewall on two side faces, facing each other in the width direction of the at least one of the plurality of grooves, of the columnar body and the first conductive layer;
    forming a first impurity region by injecting impurities into the semiconductor substrate using the columnar body and the source/drain sidewall as a mask;
    forming an interlayer insulating layer on the semiconductor substrate;
    forming a through hole reaching the first impurity region in the interlayer insulating layer; and
    embedding, within the through hole, a conductive member which is connected to the first impurity region.

11. The method according to claim 10, further comprising, before the forming the source/drain sidewall:
    forming an extension sidewall on the two side faces, facing each other in the width direction of the at least one of the plurality of grooves, of the columnar body and the first conductive layer; and
    forming a second impurity region by injecting impurities into the semiconductor substrate using the columnar body and the extension sidewall as a mask.

12. A method for manufacturing a semiconductor device, the method comprising:
    forming a plurality of grooves extending in a first direction on a semiconductor substrate;

forming an insulating layer on an inner face of the plurality of grooves and on a top face of the semiconductor substrate;

depositing a first conductive layer on the insulating layer so as to fill in the plurality of grooves;

depositing a second conductive layer on the first conductive layer;

forming a hard mask in a region, including part of a region immediately above at least one of the plurality of grooves, on the second conductive layer;

forming a columnar body including the hard mask and the second conductive layer by etching the second conductive layer using the hard mask as a mask;

forming an electrode processing sidewall on two side faces, facing each other in a width direction of the at least one of the plurality of grooves, of the columnar body;

removing an exposed portion in the first conductive layer by performing etching using the columnar body and the electrode processing sidewall as a mask; and removing the electrode processing sidewall.

13. The method according to claim 12, wherein
the thickness of the electrode processing sidewall is set not less than an estimated length of deviation between a position of the at least one of the plurality of grooves and a position of the hard mask.

14. The method according to claim 12, wherein
the material of the electrode processing sidewall contains carbon.

15. The method according to claim 14, wherein
forming the electrode processing sidewall includes:
   forming a film containing carbon on the semiconductor substrate by the chemical vapor deposition method using a gas containing carbon, nitrogen, and hydrogen; and
   removing a portion formed on other than the two side faces in the film containing carbon.

16. The method according to claim 12, wherein
forming the columnar body includes forming a barrier metal sidewall on two side faces, facing each other in the width direction of the at least one of the plurality of grooves, of the hard mask and the second conductive layer after etching the second conductive layer so that the columnar body includes the barrier metal sidewall.

17. The method according to claim 16, wherein
the hard mask and the barrier metal sidewall are formed by silicon nitride.

18. The method according to claim 12, further comprising, before the forming the plurality of grooves extending in the first direction on the semiconductor substrate, forming a plurality of element isolation regions extending in a direction intersecting the first direction on the top face of the semiconductor substrate.

19. The method according to claim 12, further comprising:
   forming a source/drain sidewall on two side faces, facing each other in the width direction of the at least one of the plurality of grooves, of the columnar body and the first conductive layer;
   forming a first impurity region by injecting impurities into the semiconductor substrate using the columnar body and the source/drain sidewall as a mask;
   forming an interlayer insulating layer on the semiconductor substrate;
   forming a through hole reaching the first impurity region in the interlayer insulating layer; and
   embedding, within the through hole, a conductive member which is connected to the first impurity region.

20. The method according to claim 19, further comprising, before the forming the source/drain sidewall:
   forming an extension sidewall on the two side faces, facing each other in the width direction of the at least one of the plurality of grooves, of the columnar body and the first conductive layer; and
   forming a second impurity region by injecting impurities into the semiconductor substrate using the columnar body and the extension sidewall as a mask.

* * * * *